United States Patent

Jones et al.

[11] Patent Number: 5,804,762
[45] Date of Patent: Sep. 8, 1998

[54] EMI SHIELDING GASKET HAVING SHEAR SURFACE ATTACHMENTS

[75] Inventors: Peter M. Jones, Londonderry; Joseph C. Houle, Salem, both of N.H.

[73] Assignee: Parker-Hannifin Corporation, Cleveland, Ohio

[21] Appl. No.: 720,104

[22] Filed: Sep. 27, 1996

Related U.S. Application Data

[60] Provisional application No. 60/013,968 Mar. 22, 1996.

[51] Int. Cl.⁶ .................................................. H05K 9/00
[52] U.S. Cl. ...................... 174/356 C; 277/653; 277/920
[58] Field of Search .................. 174/35 R, 35 MS, 174/35 GC; 439/86, 609, 927, 89; 220/304, 310.1, 681; 277/228, 229, 235 R, 227, 920, 653

[56] References Cited

U.S. PATENT DOCUMENTS

| | | | |
|---|---|---|---|
| 3,219,747 | 11/1965 | McAdams | 174/35 GC |
| 3,752,899 | 8/1993 | Bakker | 174/35 GC |
| 4,684,762 | 8/1987 | Gladfelter | 174/36 |
| 4,857,668 | 8/1989 | Buonanno | 174/35 GC |
| 5,008,485 | 4/1991 | Kitagawa | 174/35 GC |
| 5,028,739 | 7/1991 | Keyser et al. | 174/35 GC |
| 5,105,056 | 4/1992 | Hoge, Jr. et al. | 174/35 GC |
| 5,115,104 | 5/1992 | Bunyan | 174/35 GC |
| 5,142,101 | 8/1992 | Matsuzaki et al. | 174/35 GC |
| 5,202,536 | 4/1993 | Buonanno | 174/35 GC |
| 5,205,751 | 4/1993 | Schwartz et al. | 439/86 |
| 5,317,105 | 5/1994 | Weber | 174/35 GC |
| 5,534,663 | 7/1996 | Rivers et al. | 174/35 GC |
| 5,569,877 | 10/1996 | Yumi | 174/35 GC |

FOREIGN PATENT DOCUMENTS

| | | | |
|---|---|---|---|
| 0 584 896 A1 | 3/1994 | European Pat. Off. | |
| 2174551 | 11/1996 | United Kingdom | 174/35 GC |

*Primary Examiner*—Kristine L. Kincaid
*Assistant Examiner*—Hung V. Ngo
*Attorney, Agent, or Firm*—John A. Molnar

[57] ABSTRACT

An electromagnetic interference (EMI) shielding gasket for mounting on a substrate having a surface. The gasket is formed of a resilient, elongate core member extending along a central longitudinal axis and having an outer circumferential surface defininga cross-sectional profile, and an electrically-conductive outer member having an inner and an outer surface and extending from a first distal end to a sheathing portion. The sheathing portion of the outer member covers a portion of the circumferential surface of the core member and extends from a first proximal end to a second proximal end. The first distal end of the outer member and the first proximal end of the sheathing portion thereof define a first inner shear surface therebetween which is attachable to the substrate. The uncovered portion of the circumferential surface of the core member defines an interface surface for disposition on the surface of the substrate.

11 Claims, 1 Drawing Sheet

EMI SHIELDING GASKET HAVING SHEAR SURFACE ATTACHMENTS

This application claims the benefit of U.S. Provisional application Ser. No.: 60/013,968 Mar. 22,1996.

BACKGROUND OF THE INVENTION

The present invention relates broadly to an electromagnetic interference (EMI) shielding gasket or seal having an inner, resilient core, and an outer, electrically-conductive member, the ends of which define shear surfaces for the improved mounting of the gasket to a substrate.

The operation of electronic devices such as computers, business machines, communications equipment, and the like is attended by the generation of electromagnetic radiation within the electronic circuitry of the equipment. As is detailed in U.S. Pat. Nos. 5,202,536; 5,142,101; 5,105,056; 5,028,739; 4,952,448; and 4,857,668, such radiation often develops as a field or as transients within the radio frequency band of the electromagnetic spectrum, i.e., between about 10 KHz and 10 GHz, and is termed "electromagnetic interference" or "EMI" as being known to interfere with the operation of other proximate electronic devices.

To attenuate EMI effects, shielding having the capability of absorbing and/or reflecting EMI energy may be employed both to confine the EMI energy within a source device, and to insulate that device or other "target" devices from other source devices. Such shielding is provided as a barrier which is inserted between the source and the other devices, and typically is configured as an electrically conductive and grounded housing which encloses the device. As the circuitry of the device generally must remain accessible for servicing or the like, most housings are provided with openable or removable accesses such as doors, hatches, panels, or covers. Between even the flattest of these accesses and its corresponding mating or faying surface, however, there may be present gaps which reduce the efficiency of the shielding by presenting openings through which radiant energy may leak or otherwise pass into or out of the device. Moreover, such gaps represent discontinuities in the surface and ground conductivity of the housing or other shielding, and may even generate a secondary source of EMI radiation by functioning as a form of slot antenna. In this regard, bulk or surface currents induced within the housing develop voltage gradients across any interface gaps in the shielding, which gaps thereby function as antennas which radiate EMI noise. In general, the amplitude of the noise is proportional to the gap length, with the width of the gap having less appreciable effect.

For filling gaps within mating surfaces of housings and other EMI shielding structures, gaskets and other seals have been proposed both for maintaining electrical continuity across the structure, and for excluding from the interior of the device such contaminates as moisture and dust. Such seals are bonded or mechanically attached to, or press-fit into, one of the mating surfaces, and function to close any interface gaps to establish a continuous conductive path thereacross by conforming under an applied pressure to irregularities between the surfaces. Accordingly, seals intended for EMI shielding applications are specified to be of a construction which not only provides electrical surface conductivity even while under compression, but which also has a resiliency allowing the seals to conform to the size of the gap. The seals additionally must be wear resistant, economical to manufacture, and capability of withstanding repeated compression and relaxation cycles. For further information on specifications for EMI shielding gaskets, reference may be had to Severinsen, J., "Gaskets That Block EMI," Machine Design, Vol. 47, No. 19, pp. 74–77 (Aug. 7, 1975).

Conventionally, the EMI shielding gaskets heretofore known in the art have involved a resilient core element having gap-filling capabilities, around which is provided a conductive, tubular sleeve or other sheathing. The resilient core element typically is formed of an elastomeric foam which may be a foamed elastomeric thermoplastic such as a polyethylene, polypropylene, polypropylene-EPDM blend, butadiene, styrene-butadiene, nitrile, or chlorosulfonate, or a foamed neoprene, urethane, or silicone. Alternatively, an unfoamed silicone, urethane, neoprene, or thermoplastic may be utilized in either a solid or tubular form. Resilient, thermoplastic elastomeric foams and methods for making the same are detailed in U.S. Pat. Nos. 5,393,796; 5,070,111; and 4,898,760.

The sheathing may be provided as a woven or non-woven fabric, or as a knitted mesh. The fabric or mesh may be formed of a metal wire such as copper, nickel, silver, aluminum, tin or an alloy such as Monel, or of other conductive fibers such as carbon, graphite, or a conductive polymer. Alternatively, nonconductive natural or synthetic fibers such as cotton, wool, silk, cellulose, polyester, polyamide, nylon, polyimide, or the like may be plated or otherwise coated with a conductive material such as metal, carbon, or the like. Depending upon the needs of the specific application for the seal, a combination of conductive and nonconductive fibers may be used. The sheathing also may be provided as laminate of a nonconductive fabric and a conductive metal foil formed of copper, aluminum, or another metal. Preferred sheathing materials, however, include nylon or polyester yarn plated with silver, copper, nickel, or tin.

A representative EMI shielding gasket which includes a resilient foam core disposed within a conductive sheath is disclosed in Buonanno, U.S. Pat. No. 4,857,668. The sheath is bonded to the foam core as an integral part of a continuous molding process in which the foam is blown or expanded within the sheath. As the foam cures, a sealed outer boundary layer forms on the surface thereof which faces the inner surface of the sheath. The outer boundary layer is stated to have an adhesive character which effects a strong bond between the foam core and the sheath. An adhesive strip may be attached at the overlapped edges at the outer edge thereof for mounting the gasket to a substrate.

Kitagawa, U.S. Pat. No. 5,008,485, discloses a conductive EMI shield including an inner seal member formed of an elastic, nonconductive material such as rubber or the like, and an outer conductive layer coated over the sealing member. Portions of the conductive layer extend beyond the seal member to directly contact the edges of a housing to which the sealing member is attached. The conductive layer is formed of a conductive compound comprising a resinous material which is filled with carbon black, a metallic powder, or the like to render it electrically conductive. With the sealing member bonded or otherwise attached to a surface of the housing, the conductive compound is sprayed in a liquid form over the sealing member. The compound then is dried or cured to form a conductive layer over the sealing member. Keyser et al., U.S. Pat. No. 5,028,739, discloses an EMI shielding gasket which includes a resilient, elastomeric core enveloped within a fine, open format knit or braided wire mesh. An adhesive strip is disposed lengthwise along a surface of the gasket which allows the gasket to be removably fastened directly to an enclosure.

Hoge, Jr., et al., U.S. Pat. No. 5,105,056, discloses an EMI shielding gasket formed of a conductive sheathing which is wrapped circumferentially around a compressible core. Where the sheathing overlaps itself, a longitudinal seam is defined to which an adhesive is applied for bonding the gasket to a panel of an enclosure or the like. Preferably, the adhesive is applied discontinuously in a repetitive pattern of non-overlapping lines extending laterally across the seam.

Bunyan, U.S. Pat. No. 5,115,104, discloses an EMI/RFI shielding gasket having a resilient core which is coated with tacky, slow-drying adhesive. The core is rendered electrically conductive by its flocked coating with conductive fibers. An unflocked area may be provided on the surface of the gasket to expose an adhesive strip. The adhesive preferably is electrically conductive to ensure an optimal shielding effect.

Matsuzaki et al., U.S. Pat. No. 5,142,101, discloses an EMI shielding gasket having a resilient core to which a metal mesh sheathing member is adhered with a rubber macromolecule adhesive or the like. The core includes a body portion for contact with a first surface of a joint of a conductive housing, and an installing portion which may be inserted into a second surface of the joint. A segregating portion is formed between the body and installation portions which separates the metal mesh from the surface of the core such that the mesh is not broken as the core is elasticly deformed during its insertion into the joint.

Buonanno, U.S. Pat. No. 5,202,536, discloses an EMI seal having an elongated, resilient core which is covered with a partial conductive sheath. A conductive portion of the sheath, preferably a metallized fabric or the like in a resin binder, is provided to extend partially around the core to define ends which are non-overlapping. A second, nonconductive sheath portion is attached to the core element to extend between the ends of the conductive sheath portion. A contact adhesive my be used to hold the seal in place.

Weber, U.S. Pat. No. 5,317,105, discloses an EMI/RFI shielding gasket formed of a flat, flexible, electrically-conductive material. Doubled-sided adhesive tape is applied to both sides surfaces of the gasket for adhering the gasket to a substrate.

European Patent No. 0,584,896, discloses a flexible rubber sealing strips for a switch gear enclosure having a hinged door. The sealing strips, which have either a convex or concave sealing face, include a hollow head section which tapers to a fastening tongue. The fastening tongue carries a self-adhesive layer protected by a removable foil. The strips are bonded to the interior of the door edges with the head section projecting to form the seal upon the closing of the door.

With respect to the adhesive bonding of the gasket to a substrate such as an enclosure or housing, the attachment surface available for defining the bondline therebetween heretofore has been limited to the area directly under gasket. That is, and as is illustrated in U.S. Pat. Nos. 4,857,668; 5,028,739; 5,105,056; and 5,115,104, the adhesive, typically a pressure sensitive adhesive (PSA) or the like, conventionally is applied to the portion of the outer surface of the gasket which is to be disposed against the substrate for defining an interface therewith. For gaskets of a relatively narrow diametric extent, however, this interface area, which is directly proportional to the shear or peel strength of the bond, may be insufficient to attain a bond which will withstand repeated compressive cyclings of the gasket or other rigorous service environments.

Complicating the aforesaid is that if a nonconductive PSA is utilized, such adhesives typically are applied to cover less than about 60% of the attachment surface of the gasket. This coverage ensures that electrical continuity is maintained between the sheathing and the substrate, but concomitantly further decreases the area available for joining the gasket to the substrate. Although an electrically-conductive PSA may be substituted and used to cover the entire attachment surface, these adhesives, as compared to their non-conductive counterparts, are known to exhibit peel strengths which are diminished as a result of their conductive particle loadings.

The available attachment surface, moreover, may be further limited depending on the geometry of the substrate to which the gasket is to be attached. For example, with respect to substrates configured as having an upstanding or otherwise perpendicularly disposed edge or the like, only a relatively narrow surface is presented for receiving the gasket. Gaskets oriented on such surfaces additionally are subject predominantly to peel rather than to shear forces. It is well known that adhesively bonded joints are more susceptible to failure from forces having an normal component applied in a peel mode as compared to forces applied in a shear mode having no appreciable normal component. Thus, the attachment of gaskets to edges or other perpendicular surfaces has been a continuing concern to the EMI shielding industry.

In response, arrangements for effecting a mechanical attachment of the gasket to the substrate have been proposed. An exemplary such arrangement is described in U.S. Pat. No. 5,142,101, wherein an EMI shielding gasket is shown as having an extension or extrusion configured to be received within a slot or grooved formed within the substrate. The provision of such extensions and grooves, however, will be appreciated to increase the costs associated with the manufacture of both the gasket and the substrate. Other methods, such as that, described in U.S. Pat. No. 5,008,485 entailing the coating of gasket with a conductive resinous material, further complicate the mounting of the gasket. It therefore will be appreciated that improvements and alternatives for the mounting of EMI shielding gaskets to substrates such as enclosures, housing, and the like would be well-received by electronics manufacturers and other concerned industries.

BROAD STATEMENT OF THE INVENTION

The present invention is directed to an electromagnetic interference (EMI) shielding gasket or seal having an inner, resilient core, and an outer, electrically-conductive member. In having at least one end of the outer member define a distal shear surface portion for attachment to a substrate, the gasket of the present invention affords an improved alternative for the mounting of gasket to the substrate. As the size of this shear surface attachment portion is not dependent upon the area directly under the gasket which interfaces with the substrate, an increased adhesive bondline area may be provided for attaching the gasket to the substrate. Moreover, in affording the provision of a pair of attachment surfaces which depend from opposite sides of the core member and are spaced apart to receive the substrate therebetween, the present invention facilitates the mounting of an EMI gasket along an edge or other perpendicular surface of the substrate.

It therefore is a feature of the present invention to provide an electromagnetic interference (EMI) shielding gasket for improved mounting on a substrate. The gasket is formed of a resilient, elongate core member extending lengthwise along a central longitudinal axis and having an outer circumferential surface defining a cross-sectional profile, and an electrically-conductive outer member having an inner and an outer surface and extending from a first distal end to a sheathing portion. The sheathing portion of the outer member covers a portion of the circumferential surface of the core member and extends from a first proximal end to a second proximal end. The first distal end of the outer member and the first proximal end of the sheeting portion thereof define a first inner shear surface therebetween which is attachable to the substrate. The uncovered portion of the circumferential surface of the core member defines an interface surface for disposition on the surface of the substrate.

It is a further feature of the invention to provide a method of mounting an EMI shielding gasket on a substrate having at least one surface. The gasket is provided as formed of a resilient, elongate core member extending lengthwise along a central longitudinal axis and having an outer circumferential surface defining a cross-sectional profile, and an electrically-conductive outer member having an inner and an outer surface and extending from a first distal end to a sheathing portion. The sheathing portion of the outer member covers a portion of the circumferential surface of the core member and extends from a first proximal end to a second proximal end. The first distal end of the outer member and the first proximal end of the sheathing portion thereof define a first inner shear surface therebetween. The uncovered portion of the circumferential surface of the core member is disposed on the surface of the substrate. The first inner shear surface of the outer member then is attached to the substrate for mounting the gasket thereon.

Advantages of the present invention include the provision of an EMI shielding gasket having an electrically-conductive outer member with at least one and preferably a pair of distal ends defining opposing shear surfaces for the improved mounting of the gasket to a surface of a substrate. Via the provision of these shear surfaces, the bondline area for joining the gasket to the substrate may be more than double as compared to the interface area directly beneath the core member of the gasket which contacts the surface of the substrate. As to mountings wherein the shear surfaces of the outer member are coplanarly attached to the surface of the substrate, the gasket of the present invention may be bonded to the substrate on each of the lateral sides of the core member. Such an arrangement resists the initiation and propagation of peel-induced cracks which ultimately lead to the failure of the joint. As to mountings wherein the gasket is received on an edge surface of the substrate, each of the shear surfaces of the outer member may be attached to substrate generally perpendicularly to the edge surface thereof. Such an arrangement develops shear rather than peel as the predominant mode of failure and thereby improves the strength and integrity of the bondlines.

Additional advantages of the present invention include an EMI shielding gasket which is easily mounting on the surface of a substrate with a pressure sensitive adhesive or the like, and which is economical to manufacture. These and other advantages will be readily apparent to those skilled in the art based upon the disclosure contained herein.

BRIEF DESCRIPTION OF THE DRAWINGS

For a fuller understanding of the nature and objects of the invention, reference should be had to the following detailed description taken in connection with the accompanying drawings wherein.

The drawings will be described further in connection with the following Detailed Description of the Invention.

DETAILED DESCRIPTION OF THE INVENTION

Figure 1:
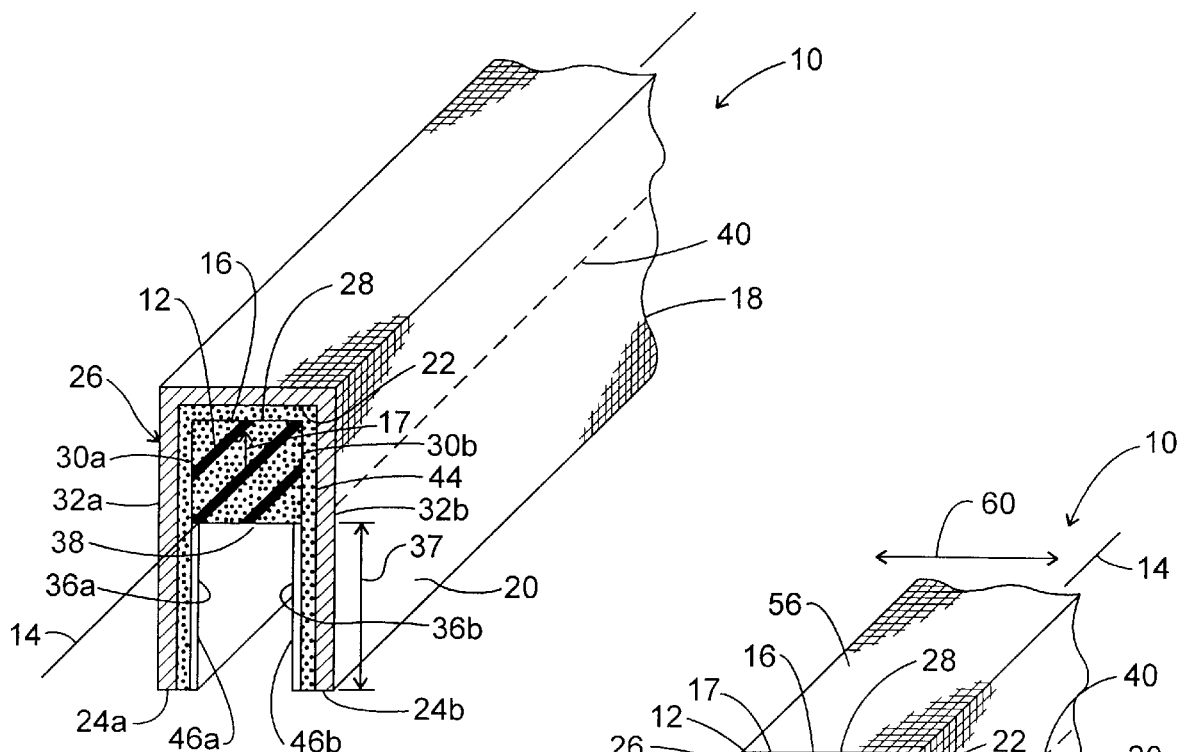
FIG. 1 is a perspective view of a cross-section of an electromagnetic interference (EMI) shielding gasket fabricated in accordance with the present invention as having an inner, resilient core, and an outer, electrically-conductive member, the ends of the outer member defining shear surface attachment portions.

Referring to FIG. 1, an electromagnetic interference (EMI) shielding gasket according to the present invention is shown generally at 10 as adapted for mounting on at least one surface (not shown) of door, panel, hatch, cover, or the like which defines an interface or parting line of an electromagnetic interference (EMI) shielding structure. The EMI shielding structure may be the conductive housing of a computer, cellular phone, or other electronic device which generates EMI radiation or is susceptible to the effects thereof. Gasket 10 may be bonded or otherwise attached to one of a pair of mating surfaces which define the interface within the housing or other shielding structure, and functions between the mating surfaces to seal any interface gaps or other irregularities. That is, while under an applied pressure given as a closure force, gasket 10 conforms to any such irregularities both to establish a continuous conductive path across the interface, and to seal the interior of the housing from the ingress of dust, moisture, or other contaminates. For illustrative purposes, gasket 10 is shown to be of an indefinite length which may cut, sectioned, or otherwise terminated for sizing to the periphery of the interface to be sealed.

In cross-section, gasket 10 of the present invention may be seen to include a inner resilient elongate core member, 12, which extends lengthwise to an indefinite length along a central longitudinal axis, 14. Core member 12 has an outer circumferential surface, 16, defining the cross-sectional profile of gasket 10 which, in turn, defines a maximum radial extent, 17, measured generally perpendicular to longitudinal axis 14. For illustrative purposes, core member 12 is shown as having a generally polygonal cross-section, viz., square or rectangular which is generally symmetrical about longitudinal axis 14. Other profiles such as circular, semi-circular, or elliptical may be substituted, however, depending upon the geometry of the interface to be sealed. Core member 12 may be of any radial or diametric extent, but for most applications will have a diametric extent or width of from about 0.25 inch (0.64 cm) to 1 inch (2.54 cm).

For affording gap-filling capabilities, it is preferred that core member 12 is provided to be complaint over a wide range of temperatures, and to exhibit good compression-relaxation hysteresis even after repeated cyclings or long compressive dwells. Core member 12 therefore may be formed of a foamed elastomeric thermoplastic such as a polyethylene, polypropylene, polypropylene-EPDM blend, butadiene, styrene-butadiene, nitrile, chlorosulfonate, or a foamed neoprene, urethane, or silicone. Preferred materials of construction include open or closed cell, extruded and cut foams formed of a foamed urethane or Santoprene® (polyolefin resin/monoolefin copolymer blend, Advanced Elastomeric Systems, L.P., St. Louis, Mo), or a neoprene, silicone, or nitrile sponge rubber.

Over inner core member 12 is sheathed an electrically conductive outer member, 18, which preferably is provided as a pre-formed fabric or mesh material. The fabric or mesh may be rendered conductive by reason of its being constructed of electrically-conductive material, or alternatively by reason of a later treatment such as plating or sputtering being applied to provide an electrically-conductive coating thereon. Electrically-conductive materials for forming outer member 18 include: carbon, graphite, and conductive polymer fibers; single or multiple strands of nonconductive, natural or synthetic fiber such as cotton, wool, silk, cellulose, polyester, polyamide, nylon, polyimide, or the like which have been coated with a conductive material such as a metal, carbon, or the like; and metal wires of copper, nickel, silver, aluminum, tin, or an alloy thereof. Preferred fibers include silver-coated nylon yarn, e.g., 100 denier multi-fill nylon yarn having 20% by weight of silver plated thereon (Sauquoit Industries, Inc., Scranton, PA), with preferred wires including Monel, silver-plated copper, nickel-clad copper, Ferrex®, aluminum, tin-clad copper, and phosphor bronze.

Depending upon the needs of the specific application for gasket 10, a combination or blend of conductive and non-conductive fibers may be used. Examples of fabrics woven, braided, or warp knitted from electrically-conductive fibers, or from blends of conductive and non-conductive fibers, are described in Gladfelter, U.S. Pat. No. 4,684,762, and in Buonanno, U.S. Pat. No. 4,857,668. Such fabrics have a thickness of from about 1–10 mils, and are available in 300 and 100 denier varieties. A preferred fabric for outer member 18 is a polyester fabric with a nickel over copper plating.

Referring again to FIG. 1, it may be seen that electrically-conductive outer member 18 is configured as having an inner and outer surface, 20 and 22, respectively, and as extending from at least a first distal end, 24a, to a sheathing portion, represented generally at 26. With respect to the illustrated embodiment, sheathing portion 26 of outer member 18 covers a portion of the circumferential surface 16 of core member 12 which is defined by upper surface 28 and lateral surfaces 30a and 30b thereof. Sheathing portion 26 extends from a first proximal end, 32a, to a second proximal end, 32b.

Figure 2:
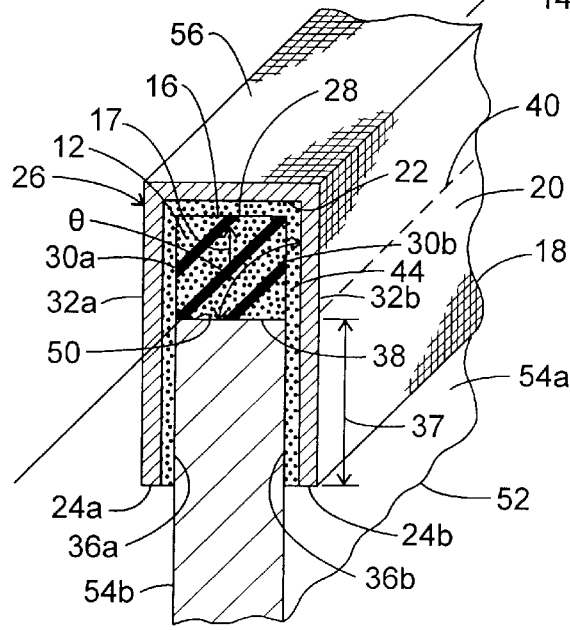
FIG. 2 is a perspective view of the EMI shielding gasket of FIG. 1 shown as being mounted along an edge surface of a substrate, the defined shear surface portions of the gasket outer member being attached to the substrate generally perpendicular to the edge surface thereof.

In accordance with the precepts of the present invention, the boundaries of first distal end 24a of outer member 18 and first proximal end 32a of sheathing portion 26 thereof define a first inner shear surface, 36a, therebetween which is attachable to the substrate (FIG. 2). The uncovered portion of circumferential surface 16 of core member 12, which in the embodiment shown is represented by lower surface of 38 of core member 12, defines an interface surface for contact with the surface of the substrate.

In a preferred embodiment, outer member 18 is provided to further extend from second proximal end 32b of sheathing portion 26 to a second distal end, 24b. The boundaries of second distal end 24b of outer member 18 and second proximal end 32b of sheathing portion 26 thereof define a second inner shear surface, 36b, therebetween. As was first inner shear surface 36a, second inner shear surface 36b is attachable to the substrate for the mounting of gasket 10 to a surface thereof. First and second inner shear surfaces 36 extend, respectively, between first and second distal ends 24 of outer member 18 and first and second proximal ends 32 of sheathing portion 26 thereof to each define, as is shown at 37 for second inner shear surface 46b, a widthwise extent. Typically, each of widthwise extents 37 are sized to be at least about equal to radial extent 17 of core member 12 in order to provide a sufficient bondline area for attaching gasket 10 to the substrate. In this regard, although inner shear surfaces 36 may be of any widthwise extent 37, and may even be of unequal widths, it is somewhat preferred to size each at least to approximate the surface area of lower surface 38 of core member 12, i.e., widthwise extends 37 each are at least about twice radial extent 17, such that the bondline area with the substrate may be effectively doubled.

Second inner shear surface 36b is shown in FIG. 1 to depend from inner core member 12 generally parallel to first inner shear surface 36a in a spaced-apart arrangement configured to receive a perpendicular substrate therebetween. It will be appreciated, however, that each of inner shear surfaces 36 are provided to be pivotal about a corresponding lower edge of core member 12, as is shown in phantom by line 40 for second inner shear surface 36b. Thus, and depending upon the specific application envisioned or the width of the substrate, inner shear surfaces 36 may be oriented to define any acute or obtuse angle therebetween, and may even be coplanarly disposed as will be detailed hereinafter in connection with FIG. 3.

For attaching first and second inner shear surfaces 36a and 36b to the substrate, it is preferred that an adhesive layer, 44, which may be a pressure sensitive variety, is disposed on the inner surface 22 of electrically-conductive outer member 18. In this way, sheathing portion 26 advantageously may be bonded to upper and lateral surfaces 28 and 30 of circumferential surface 16 of core member 12, with the remainder of adhesive layer 44 being exposed on inner surface 22 to be available for bonding shear surfaces 36 to the substrate. Although adhesive layer 44 is shown for illustrative purposes to be substantially continuously applied to coat the entirety of inner surface 22 of outer member 18, it is to be considered to be within the scope of the present invention to have adhesive layer 44 applied in a discontinuous or repetitive pattern to coat selected portions of inner surface 22 of outer member 18.

As aforementioned, adhesive layer 44 preferably is provided as a pressure sensitive adhesive (PSA). By a "PSA," it is meant that the adhesive is provided as having a sufficiently low glass transition temperature to be tacky at about room temperature, and as being adherable to a substrate with only a nominal applied pressure. Adhesives of such type are preferred for purposes of the present invention as typically requiring no additional curing steps. Moreover, such adhesives may be applied to inner surface 22 of outer member 18 in the form of a doubled sided tape, one side of which is applied to surface 22 in an automated fashion from a dispensing head using a continuous feed and nip roll pressure or the like for consolidation. Outer member 22 then may be bonded to a pre-formed core member 12 to form gasket 10.

As is described in U.S. Pat. No. 4,988,550, suitable PSAs for EMI shielding applications include formulations based on silicones, neoprene, styrene butadiene copolymers, acrylics, acrylates, polyvinyl ethers, polyvinyl acetate copolymers, polyisobutylenes, and mixtures, blends, and copolymers thereof. Acrylic-based formulations, however, generally are considered to be preferred for the EMI applications of the type herein involved. Although PSAs are preferred for adhesive layer 44, other adhesives such as epoxies and urethanes may be substituted and, accordingly, are to be considered within the scope of the present invention. Heat-fusible adhesives such a hot-melts and thermoplastic films additionally may find applicability.

Inasmuch as the bulk conductivity of gasket 10 is determined substantially through its surface contact with the substrate, an electrically-conductive PSA may be preferred to ensure optimal EMI shielding performance. Such adhesives conventionally are formulated as containing about 1–25% by weight of a conductive filler to yield a volume resistivity of from about 0.01-0.001 Ω-cm. The filler may be incorporated in the form of particles, fibers, flakes, microspheres, or microballoons, and may range in size of from about 1–100 microns. Typically filler materials include inherently conductive material such as metals, carbon, and graphite, or nonconductive materials such as plastic or glass having a plating of a conductive material such as a noble metal or the like. In this regard, the means by which the adhesive is rendered electrically conductive is not considered to be a critical aspect of the present invention, such that any means achieving the desired conductivity and adhesion are to be considered suitable.

For protecting the portion of adhesive layer 44 which is exposed on inner shear surfaces 36 of outer member 18, release sheets, as are shown at 46a and 46b, may be supplied as removably attached to the exposed adhesive. As is common in the adhesive art, release sheets 46 may be provided as strips of a waxed, siliconized, or other coated paper or plastic sheet or the like having a relatively low surface energy so as to be removable without appreciable lifting of the adhesive from the inner surface of outer member 18. Prior to use, sheets 46 therefore may be easily removed to again expose the tacky surfaces of inner shear surfaces 36.

Looking next to FIG. 2, gasket 10, with release sheets 46 removed, is shown as being mounted along an upstanding edge surface, 50, of a generally perpendicular substrate, 52, having sides 54a and 54b. The uncovered portion of outer circumferential surface 16 of inner core member 12, which portion is defined in the illustrated embodiment as lower surface 38 of core member 12, is disposed on edge surface 50 of substrate 52 to define an interface therewith. An upper surface, 56, of gasket 10 thereby is presented for an abutting, sealing engagement with a corresponding faying or mating surface (not shown). Sides 54 of substrate 52 are received between first and second shear surfaces 36a and 36b of outer member 18. For securing gasket 10 to substrate 52, inner shear surfaces 36 are attached to sides 54a and 54b, respectively. In this regard, the portion of adhesive layer 44 previously exposed on inner shear surfaces 36 is interposed between each of the surfaces and a corresponding side 54 of substrate 52. Under an applied pressure, each of the inner shear surfaces 36 are bonded to a corresponding substrate side 54 for firmly attaching gasket 10 to substrate 52. Although not shown, another adhesive layer may be interposed between lower surface 38 of core member 12 and edge surface 50 of substrate 52 to even more firmly attach gasket 10 to the substrate.

In the arrangement shown, first and second inner shear surfaces 36 are depicted as being disposed generally normal to edge surface 50 of substrate 52. However, it will be appreciated that, depending upon the configuration of the substrate, inner shear surfaces 36 may be disposed at any angle, represented at Θ for second inner shear surface 36b, with respect to the surface of the substrate along which core member 12 is positioned to extend. In this regard, each of inner shear surfaces 36 may be pivoted about a corresponding lower edge of core member 12, as again is shown in phantom by line 40 for second inner shear surface 36b.

The attachment of inner shear surfaces 36 normal to the surface of substrate 52 along which core member 12 is received will be appreciated to effect a generally preferred shear rather than peel mode of failure in response to applied forces, a representation of which is shown at 60. Moreover, in providing for a pair of attachment surfaces 36, the bondline area between gasket 10 and substrate 52 may be more than doubled. Such an arrangement further resists the initiation and propagation of peel-induced cracks which might otherwise lead to the ultimate failure of the joint. The net result is a bond strength which is improved as compared to a conventional arrangement wherein the bond is effected within the area directly under the core member of the gasket.

Figure 3:
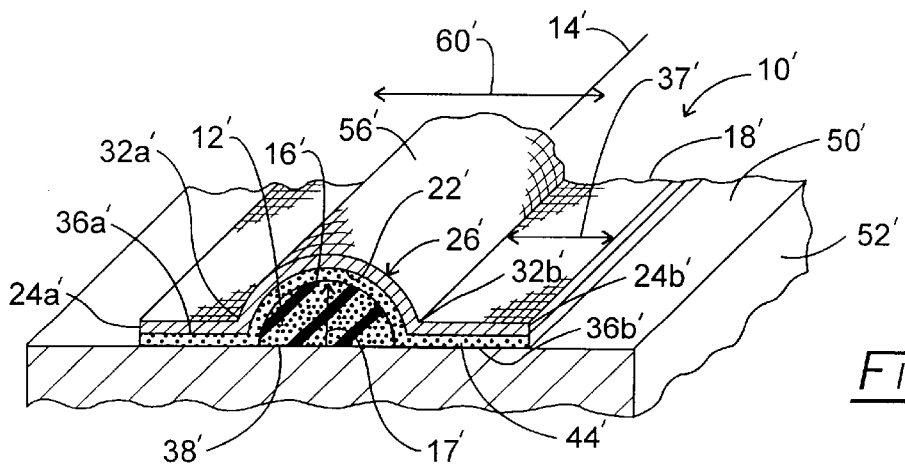
FIG. 3 is a perspective view of a cross-section of an alternative embodiment of an EMI shielding gasket according to the present invention shown as being mount along the surface of substrate, the defined shear surface portions of the gasket outer member being coplanarly attached to the substrate surface.

Referring lastly to FIG. 3, an alternative embodiment of gasket 10', with release sheets 46 removed, is shown as being mounted along a generally planar surface, 50', of a substrate, 52'. In this embodiment, outer circumferential surface 16' of inner core member 12' defines with respect to longitudinal axis 14' a generally semi-circular cross-sectional profile, which, in turn, defines maximum radial extent 17'. Again, the uncovered portion of outer circumferential surface 16', which portion is defined as lower surface 38' of core member 12', is disposed against edge surface 50' of substrate 52' to define an interface therewith. Upper surface 56' of gasket 10' thereby is presented for an abutting, sealing engagement with a corresponding faying or mating surface (not shown). For securing gasket 10' to substrate 52', inner shear surfaces 36' are attached to surface 50' of substrate 52'. The portion of adhesive layer 44' previously exposed on inner shear surfaces 36' is interposed between each of the surfaces and surface 50' of substrate 52'. As before, under an applied pressure, each of the inner shear surfaces 36' are bonded to the surface for firmly attaching gasket 10' to substrate 52'.

In the arrangement shown in FIG. 3, first and second inner shear surfaces 36' are depicted as having widthwise extents represented at 37' for second surface 36b', and as being coplanarly disposed generally parallel to surface 50' of substrate 52'. In this regard, each of inner shear surfaces 36' have been pivoted about a corresponding lower edge of core member 12'. The coplanar attachment of inner shear surfaces 36' to the surface of substrate 52' on each lateral side of core member 12' will be appreciated to resist forces 60', which may be applied from either of the directions shown, which would otherwise tend to initiate and propagate peel-induced cracks leading to the ultimate failure of the joint. Moreover, and as before, in providing for a pair of attachment surfaces 36', the bondline area between gasket 10' and substrate 52' is effectively doubled. This again results in a bond strength which is improved as compared to a conventional arrangement wherein the bond is effected directly under the core member of the gasket.

As it is anticipated that certain changes may be made in the present invention without departing from the precepts herein involved, it is intended that all matter contained in the foregoing description shall be interpreted as illustrative and not in a limiting sense. All references cited herein are expressly incorporated by reference.

What is claimed:

1. An electromagnetic interference (EMI) shielding gasket mountable on a substrate having at least one surface, said gasket being compressible intermediate the substrate surface and a mating surface and comprising:

a resilient, elongate core member extending lengthwise along a central longitudinal axis and having an outer circumferential surface defining a cross-sectional profile;

an electrically-conductive outer member having an inner and an outer surface and extending from a first distal end to a sheathing portion, said sheathing portion of said outer member covering a portion of the circumferential surface of said core member and extending from a first proximal end to a second proximal end, said first distal end of said outer member and said first proximal end of said sheathing portion thereof defining a first inner shear surface therebetween for attachment to the substrate, the uncovered portion of the circumferential surface of said core member defining an interface surface for disposing on the surface of said substrate; and an adhesive layer dispose on the inner surface of said outer member, said adhesive layer bonding said sheathing portion of said outer member to the circumferential surface of said core member and covering at least a portion of said first inner shear surface for the attachment of said first inner shear surface to the substrate.

2. The EMI shielding gasket of claim 1 wherein said outer member further extends from said second proximal end of said sheathing portion to a second distal end, said second distal end and said second proximal end defining a second inner shear surface therebetween for attachment to the substrate.

3. The EMI shielding gasket of claim 2 wherein said cross-sectional profile of said core member defines a maximum radial dimension measured generally perpendicular to said longitudinal axis, and wherein said first and said second inner shear surface of said outer member extends, respectively, between said first and second distal ends of said outer member and said first and second proximal ends of said sheathing portion to define widthwise dimensions which are each at least about equal to said radial dimension of said core member.

4. The EMI shielding gasket of claim 2 wherein said second inner shear surface is disposed generally coplanarly with said first inner shear surface.

5. The EMI shielding gasket of claim 1 wherein said electrically-conductive outer member is a conductive fabric or mesh.

6. The EMI shielding gasket of claim 1 wherein said cross-sectional profile of said core member defines a maximum radial dimension measured generally perpendicular to said longitudinal axis, and wherein said first inner shear surface of said outer member extends between said first distal end of said outer member and said first proximal end of said sheathing portion to define a widthwise dimension which is at least about equal to said radial dimension of said core member.

7. The EMI shielding gasket of claim 1 further comprising a release sheet covering the portion of said adhesive layer on said first inner shear surface, said release sheet being removable therefrom to expose said adhesive layer for attaching said first inner shear surface to the substrate.

8. The EMI shielding gasket of claim 1 wherein said adhesive layer comprises an electrically-conductive, pressure sensitive adhesive.

9. The EMI shielding gasket of claim 1 wherein said first inner shear surface is disposed generally parallel to the surface of the substrate for attachment thereto.

10. The EMI shielding gasket of claim 1 wherein said cross-sectional profile is generally circular, semi-circular, polygonal, or elliptical.

11. The EMI shielding gasket of claim 1 wherein said core member is formed of a foamed elastomeric material selected from the group consisting of polyethylenes, polypropylenes, polypropylene-EPDM blends, butadienes, styrene-butadienes, nitrites, chlorosulfonates, neoprenes, urethanes, silicones, and combinations thereof.

* * * * *